US009396949B2

(12) United States Patent
Li et al.

(10) Patent No.: US 9,396,949 B2
(45) Date of Patent: Jul. 19, 2016

(54) METHOD OF ADJUSTING A THRESHOLD VOLTAGE OF A MULTI-GATE STRUCTURE DEVICE

(71) Applicant: Peking University, Beijing (CN)

(72) Inventors: Ming Li, Beijing (CN); Jiewen Fan, Beijing (CN); Jia Li, Beijing (CN); Xiaoyan Xu, Beijing (CN); Ru Huang, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 14/415,570

(22) PCT Filed: Sep. 30, 2013

(86) PCT No.: PCT/CN2013/084739
§ 371 (c)(1),
(2) Date: Jan. 16, 2015

(87) PCT Pub. No.: WO2014/153941
PCT Pub. Date: Oct. 2, 2014

(65) Prior Publication Data
US 2015/0206752 A1 Jul. 23, 2015

(30) Foreign Application Priority Data

Mar. 28, 2013 (CN) .......................... 2013 1 0103272

(51) Int. Cl.
*H01L 21/225* (2006.01)
*H01L 21/00* (2006.01)
(Continued)

(52) U.S. Cl.
CPC ............ *H01L 21/2252* (2013.01); *H01L 21/00* (2013.01); *H01L 29/0673* (2013.01); *H01L 29/105* (2013.01); *H01L 29/66795* (2013.01);
(Continued)

(58) Field of Classification Search
None
See application file for complete search history.

(56) References Cited

U.S. PATENT DOCUMENTS

| 2004/0152247 A1 | 8/2004 | Koh |
| 2009/0230469 A1 | 9/2009 | Sato |
| 2011/0089495 A1* | 4/2011 | Gluschenkov et al. ....... 257/369 |

FOREIGN PATENT DOCUMENTS

| CN | 1227965 A | 9/1999 |
| CN | 101199045 A | 6/2008 |

(Continued)

*Primary Examiner* — Scott B Geyer
(74) *Attorney, Agent, or Firm* — Thorpe North & Western, LLP

(57) ABSTRACT

The present invention discloses a method of adjusting a threshold voltage of a multi-gate structure device, wherein, preparing the multi-gate structure device to be formed to have a channel impurity distribution with high doping on surface and lowly doping inside, where while a threshold voltage is adjusted by using impurity doping, the influences of the Coulomb impurity scattering on the carriers is reduced as much as possible, so that the mobility of the carriers is maintained at a higher level. Firstly, the present solution is able to make a multi-gate device obtain a larger range of a multi-threshold voltage; it is convenient for the various demands of the device in the circuit designing by IC designers. Secondly, in the course of introducing the impurity doping to adjust a threshold voltage, the influences of the Coulomb impurity scattering on the channel carrier are reduced as much as possible, so that the mobility of the charge carriers is maintained at a higher level, and the device is ensured to have a higher drive current. Finally, the present solution is achieved by the process method compatible with a conventional CMOS, and has the potential for a large scale production.

5 Claims, 3 Drawing Sheets

(51) Int. Cl.
*H01L 29/06* (2006.01)
*H01L 29/66* (2006.01)
*H01L 29/10* (2006.01)
*H01L 29/78* (2006.01)
*H01L 29/775* (2006.01)

(52) U.S. Cl.
CPC ........... *H01L 29/7855* (2013.01); *H01L 29/775* (2013.01)

(56) References Cited

FOREIGN PATENT DOCUMENTS

| | | |
|---|---|---|
| CN | 101207039 A | 6/2008 |
| CN | 103219242 A | 7/2013 |
| WO | WO 2014/153941 A1 | 10/2014 |

* cited by examiner

METHOD OF ADJUSTING A THRESHOLD VOLTAGE OF A MULTI-GATE STRUCTURE DEVICE

CROSS REFERENCE OF RELATED APPLICATIONS

This application is a 371 U.S. Nationalization of Patent Cooperation Treaty Application PCT/CN2013/084739, filed Sep. 30, 2013, which claims the benefit of Chinese Patent Application No. 201310103272.X, filed on Mar. 28, 2013, each of which are incorporated herein by reference in their entirety.

TECHNICAL FIELD

The present invention relates to a method of adjusting a threshold voltage of a multi-gate structure device, which belongs to a field of ultra large scale integrated circuit manufacturing technology.

BACKGROUND OF THE INVENTION

Today's semiconductor manufacturing industry is rapidly developing under the guidance of Moore's Law, so as to continuously improve performance and integration density of integrated circuits while reducing power consumption as much as possible. Preparation of a high-performance, low-power ultra short channel device becomes the focus of the future semiconductor manufacturing industry. After entering the 22 nm technology node, in a conventional planar field effect transistor a leakage current is increasing due to a growing short channel effect, which can not meet the development of semiconductor manufacturing. In order to overcome the above issues, a multi-gate structure device is gradually attracting widespread attentions, because it can increase the driving current density per unit area while overcoming the short channel effect due to excellent gate control properties and transport characteristics thereof.

Although the multi-gate structure device itself has a characteristic geometry structure, so that it has excellent gate control performance, this will make a body effect factor decrease. Accordingly, in comparison to a conventional planar device, it is difficult to achieve a multi-threshold device from a multi-gate structure device. Under the same process conditions, a conventional method of achieving a multi-threshold device is to conduct a channel doping, and a multi-gate structure device requires a higher channel doping concentration in order to achieve a threshold voltage variation. However, due to the presence of Coulomb impurity scattering, improvement of a channel doping concentration will seriously affect the mobility of carriers in the device, finally so that the driving current is dropped significantly. This is one of the major difficulties and challenges when a multi-gate structure device is applied to a large scale integrated circuit product.

SUMMARY OF THE INVENTION

The objective of the present invention is to provide a method of adjusting a threshold voltage of a multi-gate structure device, aiming at the issues that a multi-gate structure device is more difficult to achieve a multi-threshold. By using the method, the influences of the Coulomb impurity scattering on the channel carriers is reduced so that mobility of the carriers is maintained at a higher level to ensure the device to have a higher drive current, while the multi-gate device obtains a larger range of a multi-threshold voltage. Moreover, the method can be achieved by the process method compatible with the conventional CMOS.

The technical solutions of the present invention are offered as follows:

A method of adjusting a threshold voltage of a multi-gate structure device, wherein, preparing the multi-gate structure device to be formed to have a channel impurity distribution with a high doping on surface (i.e. high surface doping) and a low doping inside (i.e. low internal doping), where a three-gate structure device on SOI substrate is taken for an example, as shown in FIG. 1 (FIG. 2 is a schematic view illustrating a channel impurity concentration distribution of a three-gate device according to the present invention solution).

The main concept is to reduce the influences of the Coulomb impurity scattering on the carriers as much as possible so that mobility of the carriers is maintained at a higher level, while adjusting a threshold voltage by using an impurity doping.

For a multi-gate structure device in a small size (after the 22 nm technical node), due to the characteristics of a full depletion and a volume inversion, a carrier distribution is different from a conventional planar device. In a full depletion multi-gate structure device, the carrier distribution in a channel is concentrated in a channel body region with spacing from the channel surface by a distance.

A region (the channel surface) with a lower carrier concentration is highly doped and a region (the channel body region) with a higher carrier concentration is lowly doped, so that the Coulomb impurity scattering is reduced as much as possible for the carriers while the threshold voltage is adjusted by doping with impurities.

In comparison to a conventional solution that a channel is entirely doped with impurities, under the condition of having the same changes of threshold voltage, the average mobility of the carriers in present solution is high, thus ensuring that the multi-gate device has a higher drive current. Meanwhile, the control ability for short channel effect by the two solutions is same, the device simulation results are shown in FIG. 3 to FIG. 6.

A process method of preparing a channel with highly doping on surface and low doping inside is offered as follows:

The main concept is to prepare a ultra-shallow high and low junction channel with impurities being distributed evenly on a three-dimensional structure by a ultra-shallow junction process compatible with a conventional CMOS process, 1) impurities doping to achieve a 1 nm of ultra-shallow impurity distribution. The step may be achieved by a plasma impurity doping technology, a silicon epitaxial in situ doping technology or a monolayer doping technology.

2) depositing a passivation layer to form the passivation layer of a certain thickness (20 nm), so that in the subsequent annealing process, the loss of the doped impurity is reduced as much as possible. The step may be achieved by a variety of common deposition ways, such as an atomic layer deposition, a low pressure chemical vapor deposition, etc.

3) annealing to form an ultra shallow junction of a 1~2 nm thickness. The step may be achieved by the advanced annealing technologies such as a Spike annealing, a Flash annealing, a laser annealing or the like, where under the condition of ensuring the activated impurity concentration, the diffusion of impurities is reduced as much as possible.

The present invention has the following advantageous technical effects.

Firstly, the present solution is able to make a multi-gate device obtain a larger range of a multi-threshold voltage, it is convenient for the various demands of the device in the circuit designing by IC designers. Secondly, in the course of introducing the impurity doping to adjust a threshold voltage, the influences of the Coulomb impurity scattering on the channel carrier are reduced as much as possible, so that the mobility of the charge carriers is maintained at a higher level, and the device is ensured to have a higher drive current. Finally, the present solution is achieved by the process method compatible with a conventional CMOS, and has the potential for a large scale production.

DETAILED DESCRIPTION OF THE EMBODIMENTS

Figure 1:
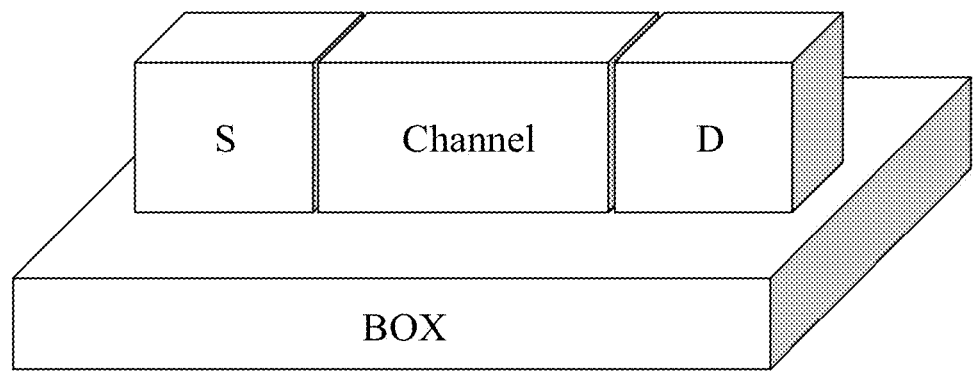
FIG. 1 is a structure view of a three-gate device on SOI substrate.
Figure 2:
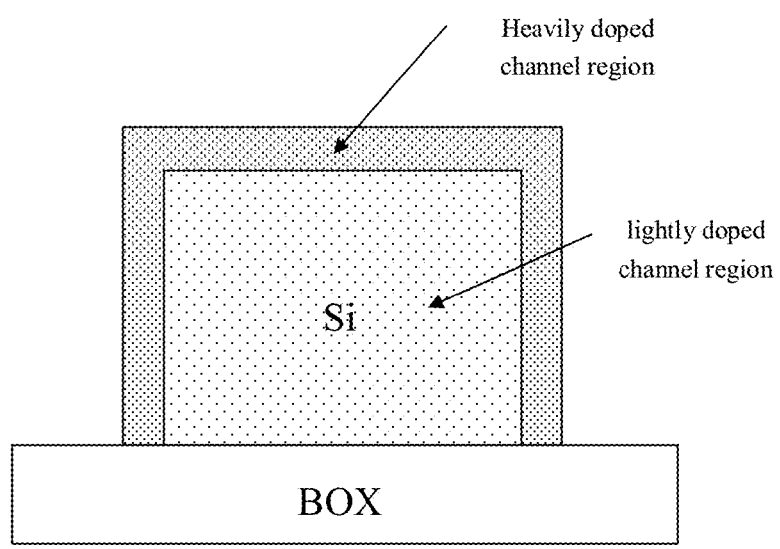
FIG. 2 is a schematic view of a channel impurity concentration distribution of a three-gate device according to the present invention solution.
Figure 3:
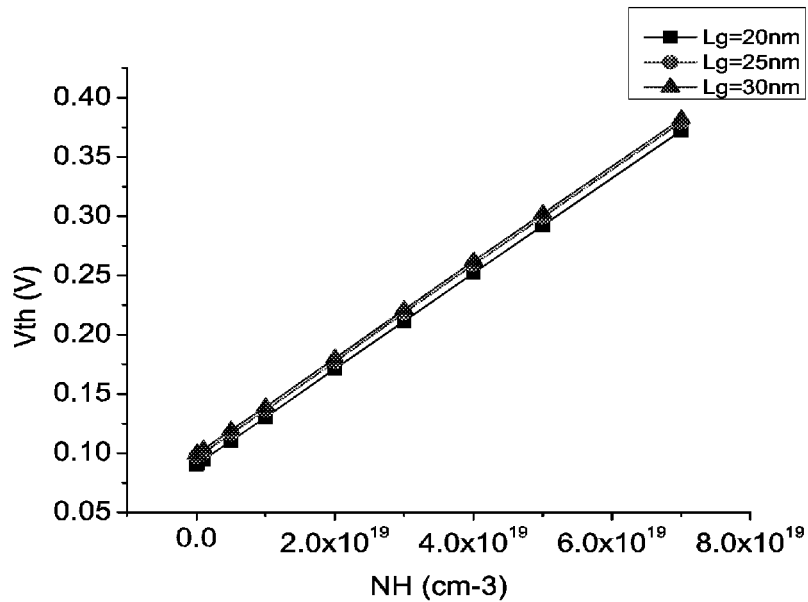
FIG. 3 is a chart illustrating an adjustment of a threshold voltage with respect to a impurity concentration under different channel lengths according to the conventional channel impurity distribution.
Figure 4:
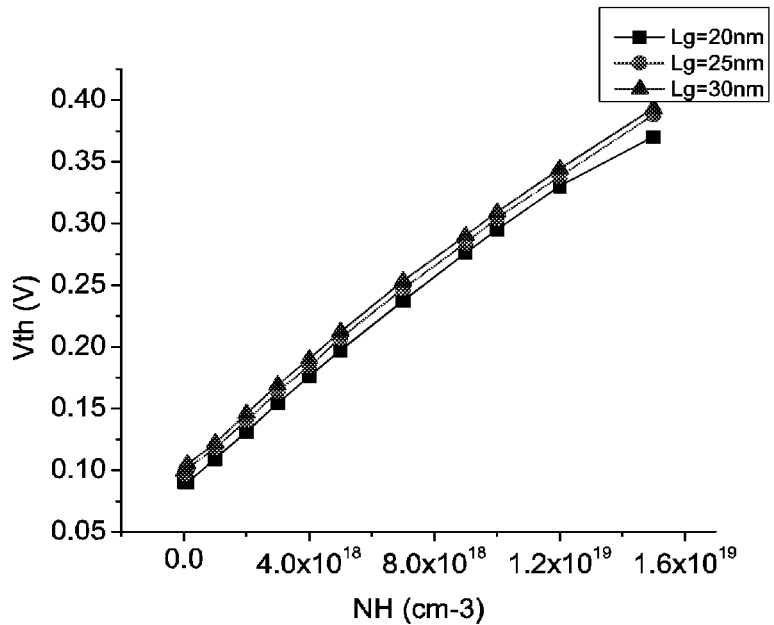
FIG. 4 is a chart illustrating an adjustment of a threshold voltage with respect to a impurity concentration under different channel lengths according to the present solution channel impurity distribution.
Figure 5:
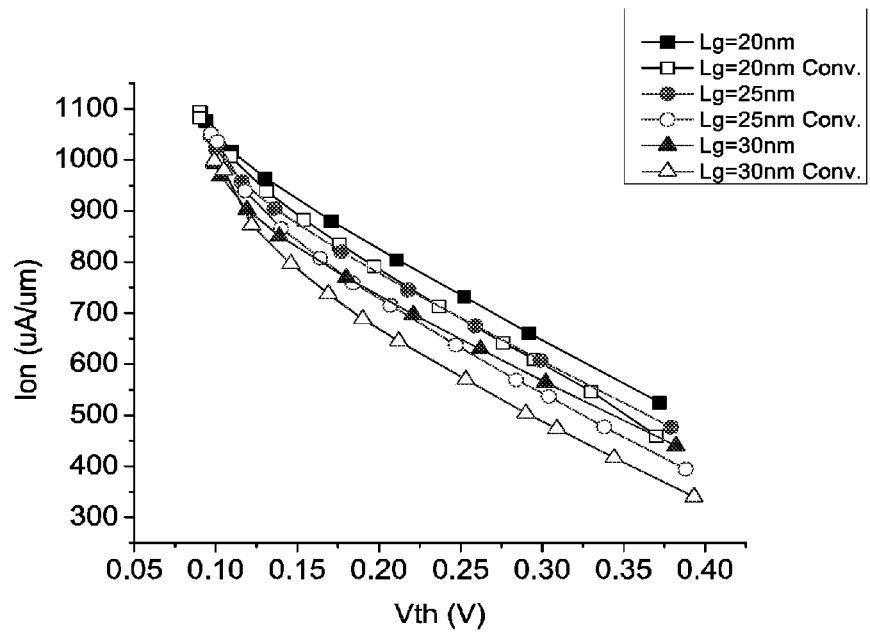
FIG. 5 is a chart illustrating the drive current with respect to different threshold voltages according to the channel impurity distributions of the two solutions.
Figure 6:
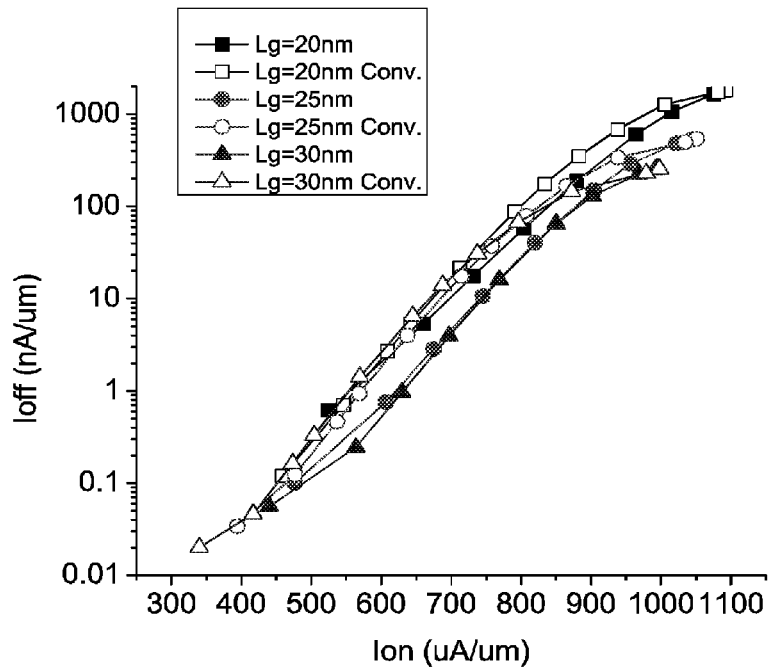
FIG. 6 is a chart illustrating the drive current with respect to the leakage current according to the channel impurity distributions of the two solutions.

Hereinafter, the present invention will be described in detail in conjunction with the specific embodiments. Specifically, this is to provide a process solution that achieves a multi-threshold voltage of a multi-gate structure device proposed by the present invention, and a three-gate structure device is taken for example (Obviously, the solutions of the present invention is fully applicable to the other multi-gate structures), but it is not to limit the scope of the present invention in any ways.

A n-type three-gate field effect transistor with a Fin strip having a width of about 10 nm, a height of 30 nm and a channel length of about 25 nm is prepared according to the following steps:

1) highly doping the channel surface, with a doping dose of $1e15\,cm^{-2}$, by a plasma impurity doping technology, a silicon epitaxial in situ doping technology or a monolayer doping technology;

2) depositing oxide silicon to a thickness of 100 Å by Atomic Layer Deposition;

3) activating the impurities in a channel region, and performing a laser annealing for 1 ns under a temperature of 1100°;

4) isotropic wet etching the oxide silicon having the thickness of 100 Å with HF solution.

The embodiment described above is not constructed to limit the present invention, various changes and modifications may be made by any skilled in the art without departing from the spirit and scope of the invention, accordingly, the protected scope of present invention is defined by the scope of the following claims.

What is claimed is:

1. A method of adjusting a threshold voltage of a multi-gate structure device, the channel of which includes a channel surface and a channel body spaced from the channel surface and having a higher carrier concentration than that of the channel surface under a full depletion, comprising:
preparing the multi-gate structure device to form the channel surface and the channel body with a lower impurity doping concentration than that of the channel body,
wherein, a process of preparing the multi-gate structure device comprises the steps of:
1) impurities doping to form an ultra-shallow impurity distribution of a 1 nm thickness;
2) depositing a passivation layer to reduce the loss of the doped impurity in a subsequent annealing process;
3) annealing to form an ultra-shallow junction of a 1~2 nm thickness.

2. The method of adjusting a threshold voltage of a multi-gate structure device according to claim 1, wherein, the step 1) is achieved by a plasma impurity doping technology, a silicon epitaxial in-situ doping technology or a monolayer doping technology.

3. The method of adjusting a threshold voltage of a multi-gate structure device according to claim 1, wherein, the step 2) is achieved by an atomic layer deposition or a low pressure chemical vapor deposition method.

4. The method of adjusting a threshold voltage of a multi-gate structure device according to claim 1, wherein, the step 3) is achieved by a spike annealing, a flash annealing or a laser annealing.

5. The method of adjusting a threshold voltage of a multi-gate structure device according to claim 1, wherein, the thickness of the passivation layer in the step 2) is 20 nm.

* * * * *